United States Patent
Kojima et al.

(10) Patent No.: US 7,635,868 B2
(45) Date of Patent: Dec. 22, 2009

(54) SILICON CARBIDE EPITAXIAL WAFER, METHOD FOR PRODUCING SUCH WAFER, AND SEMICONDUCTOR DEVICE FORMED ON SUCH WAFER

(75) Inventors: Kazutoshi Kojima, Ibaraki (JP); Satoshi Kuroda, Ibaraki (JP); Hajime Okumura, Ibaraki (JP)

(73) Assignee: National Institute of Advanced Industrial Science and Technology (JP)

( * ) Notice: Subject to any disclaimer, the term of this patent is extended or adjusted under 35 U.S.C. 154(b) by 324 days.

(21) Appl. No.: 10/567,729

(22) PCT Filed: Aug. 19, 2004

(86) PCT No.: PCT/JP2004/011894

§ 371 (c)(1),
(2), (4) Date: Feb. 1, 2006

(87) PCT Pub. No.: WO2005/017986

PCT Pub. Date: Feb. 24, 2005

(65) Prior Publication Data

US 2007/0001175 A1    Jan. 4, 2007

(30) Foreign Application Priority Data

Aug. 19, 2003    (JP) .............................. 2003-295413

(51) Int. Cl.
*H01L 31/0312*    (2006.01)

(52) U.S. Cl. .......... 257/77; 257/E29.004; 257/E29.104; 438/931

(58) Field of Classification Search ................ 257/77, 257/E21.054, E29.004, E29.104; 438/105, 438/931, 906
See application file for complete search history.

(56) References Cited

U.S. PATENT DOCUMENTS

| | | | |
|---|---|---|---|
| 4,912,064 A | | 3/1990 | Kong et al. |
| 5,011,549 A | | 4/1991 | Kong et al. |
| 5,248,385 A | * | 9/1993 | Powell ........................ 438/507 |
| 6,165,874 A | * | 12/2000 | Powell et al. ............... 438/478 |
| 6,329,088 B1 | | 12/2001 | Landini et al. |
| 2006/0011128 A1 | * | 1/2006 | Ellison et al. .................. 117/84 |

FOREIGN PATENT DOCUMENTS

JP    2003-137694    5/2003

OTHER PUBLICATIONS

Steckl et al. ("Epitaxial Growth of B-SiC on Si by RTCVD with C3H8 and SiH4"; IEEE Transactions on Electron Devices vol. 39, No. 1, Jan. 1992 pp. 64-73).*
Hallin et al. "Homoepitaxial on-axis growth of 4H- and 6H-SiC by CVD" Materials Science Forum vols. 457-460 (2004) pp. 193-196.*

(Continued)

*Primary Examiner*—Wael Fahmy
*Assistant Examiner*—Sarah K Salerno
(74) *Attorney, Agent, or Firm*—Howson & Howson LLP

(57) ABSTRACT

Provided is a silicon carbide epitaxial wafer which is formed on a substrate that is less than 1° off from the {0001} surface of silicon carbide having an α-type crystal structure, wherein the crystal defects in the SiC epitaxial wafer are reduced while the flatness of the surface thereof is improved.

7 Claims, 3 Drawing Sheets

OTHER PUBLICATIONS

Nakamura et al., "Surface Mechanisms in Homoepitaxial Growth on alpha-SiC {0001}-vicinal Faces;" Silicon Carbide and Related Materials; Material Science Forum; 2003; pp. 163-168.*

Kojima et al., "4H-SiC Carbon-Face Epitaxial Layers Grown by Low Pressure Hot-Wall Chemical Vapor Deposition;" Material Science Forum; 2003; pp. 209-212; vols. 457-460; Trans Tech Publications; Switerland.*

* cited by examiner

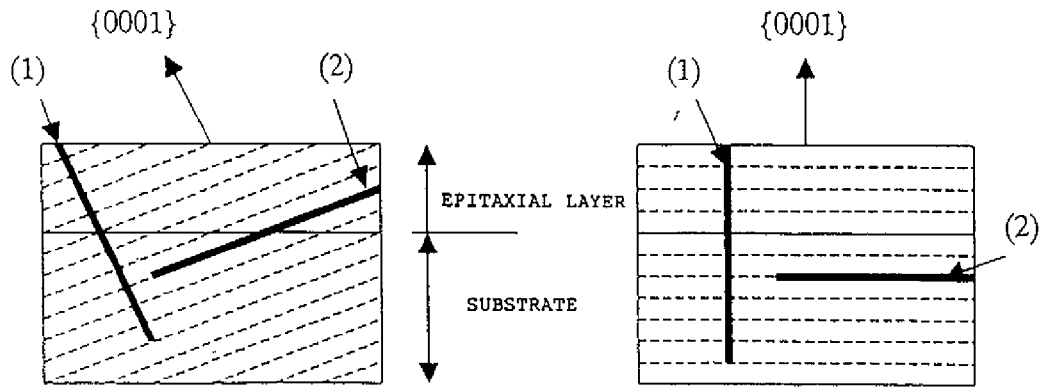
FIG. 1a   FIG. 1b
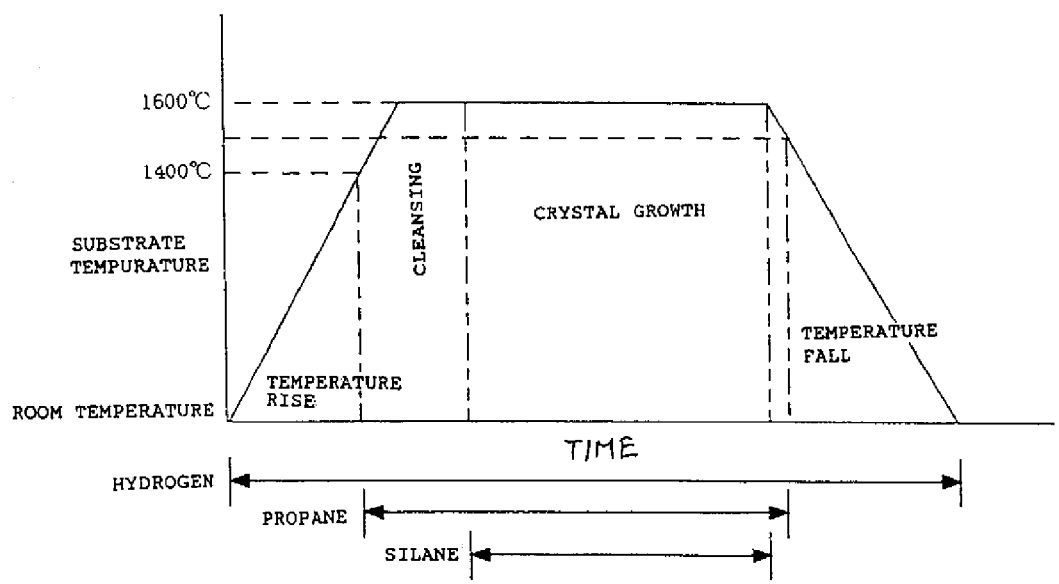
FIG. 2

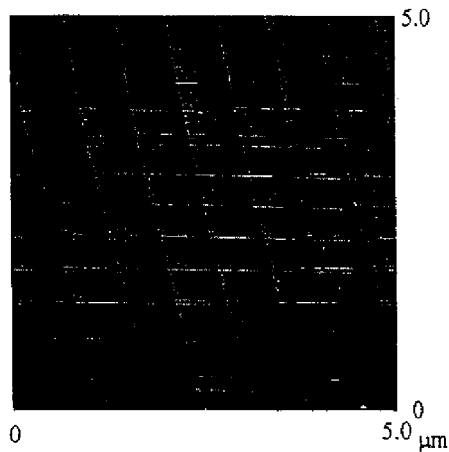
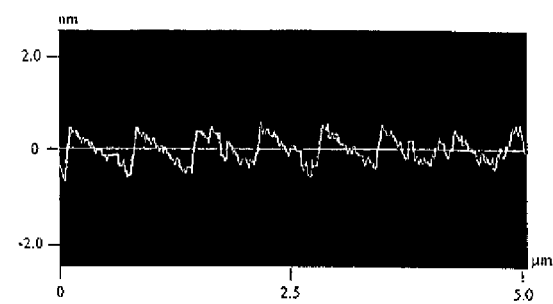
FIG. 3b
FIG. 3a
FIG. 4

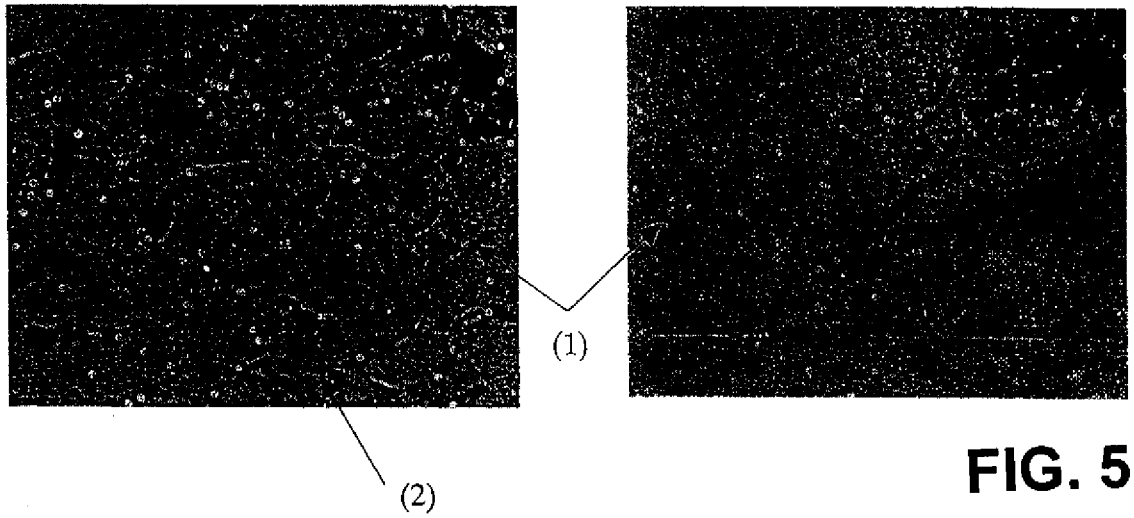
FIG. 5a
FIG. 5b
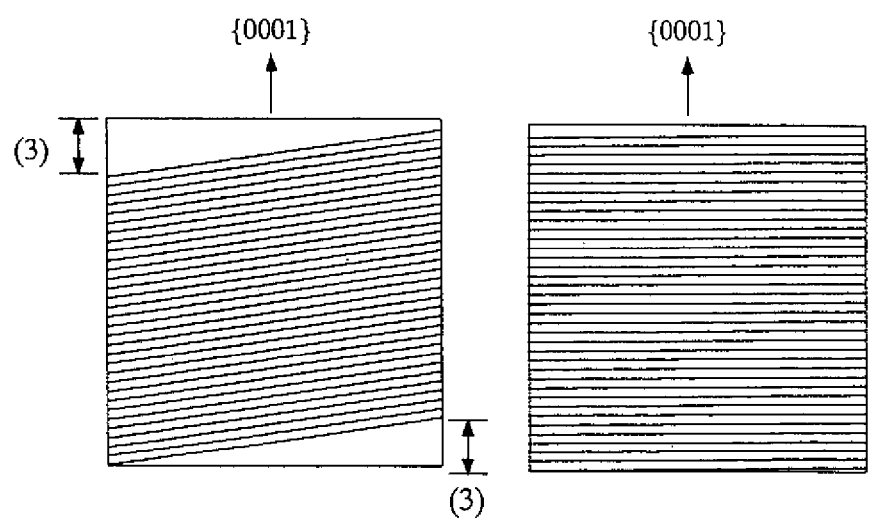
FIG. 6a
FIG. 6b

SILICON CARBIDE EPITAXIAL WAFER, METHOD FOR PRODUCING SUCH WAFER, AND SEMICONDUCTOR DEVICE FORMED ON SUCH WAFER

BACKGROUND OF THE INVENTION

The present invention relates to a high-quality silicon carbide (SiC) epitaxial wafer obtained from the crystal growth of silicon carbide, manufacturing method of such wafer, and semiconductor device formed on this wafer.

Since SiC has various crystal structures, in the epitaxial growth of the SiC {0001} face, SiC having a different crystal structure easily gets mixed -into the epitaxially grown portion.

Further, the flatness of the growth surface will be lost due to step bunching or two-dimensional nucleus formation. Thus, in order to form an epitaxial wafer having a flat and uniform crystal structure, with the conventional epitaxial wafer manufacturing technology, a SiC substrate (off substrate) inclined 3° to 8° in the [11$\bar{2}$0] direction of the {0001} face is used, and an epitaxial wafer is formed on such substrate with the chemical vapor deposition method (CVD method) (c.f. Patent Document 1).

[Patent Document 1] U.S. Pat. No. 4,912,064

SiC has crystal defects extending in the {0001} direction and crystal defects extending in a direction perpendicular to the {0001} direction. Thus, when an epitaxial wafer is manufactured based on the technology described in Patent Document 1, since both crystal defects existing in the substrate are propagated to the epitaxially grown portion, it is difficult to reduce the defects in the wafer. This situation is shown in FIG. 1a.

Further, in the manufacture of a SiC epitaxial wafer, the (0001) Si face is used for epitaxial growth. Nevertheless, as the angle of the off substrate becomes small, during the epitaxial growth of the (0001) Si face, step bunching and two-dimensional nucleus formation will occur and the flatness of the epitaxially grown surface will be lost.

SUMMARY OF THE INVENTION

In consideration of the foregoing problems, an object of the present invention is to provide a method of manufacturing an epitaxial wafer having a highly flat surface while reducing the crystal defects in the SiC epitaxial wafer, the SiC epitaxial wafer obtained thereby, and a semiconductor device formed on such wafer.

The present inventors achieved the present invention by discovering that the foregoing defects can be reduced by adjusting the off angle from the {0001} face of the SiC substrate, and controlling the growth pressure and composition ratio of the source gas.

In other words, the present invention provides the following invention: 1) A silicon carbide epitaxial wafer which is formed on a substrate that is less than 1° off from the {0001} surface of silicon carbide having an α-type crystal structure. 2) The silicon carbide epitaxial wafer according to 1) above, wherein said silicon carbide epitaxial wafer is formed on a substrate of the (000$\bar{1}$) C face. 3) The silicon carbide epitaxial wafer according to 1) or 2) above, wherein a silicon carbide substrate having a 4H crystal structure is used. 4) The silicon carbide epitaxial wafer according to any one of 1) to 3) above, wherein said silicon carbide epitaxial wafer has a flat surface. 5) A semiconductor device formed on the epitaxial wafer according to any one of 1) to 4) above. 6) A manufacturing method of a silicon carbide epitaxial wafer, wherein silicon carbide is epitaxially grown on a substrate that is less than 1° off from the {0001} surface of silicon carbide having an α-type crystal structure. 7) The manufacturing method of a silicon carbide epitaxial wafer according to 6) above, wherein silicon carbide is epitaxially grown on a substrate of the (000$\bar{1}$) C face. 8) The manufacturing method of a silicon carbide epitaxial wafer according to 6) or 7) above, wherein silicon carbide is epitaxially grown on a silicon carbide substrate having a 4H crystal structure. 9) The manufacturing method of a silicon carbide epitaxial wafer according to any one of 6) to 8) above, wherein the substrate surface is cleansed with a mixed gas of hydrogen gas and propane gas of 1400° C. to 1600° C. 10) The manufacturing method of a silicon carbide epitaxial wafer according to any one of claims 6 to 9, wherein the height of the substrate surface step is 1 nm or less. 11) The manufacturing method of a silicon carbide epitaxial wafer according to any one of 6) to 10) above, wherein a source gas of silane and propane is used upon epitaxially growing silicon carbide. 12) The manufacturing method of a silicon carbide epitaxial wafer according to any one of 6) to 11) above, wherein a growth pressure of 250 mbar or less is used upon epitaxially growing silicon carbide. 13) The manufacturing method of a silicon carbide epitaxial wafer according to any one of 6) to 12) above, wherein a source gas in which the composition ratio of C and Si is 1 or less is used upon epitaxially growing silicon carbide. 14) A silicon carbide epitaxial wafer manufactured with the epitaxial growth according to any one of 6) to 13) above. 15) A semiconductor device formed on the silicon carbide epitaxial wafer according to 14) above.

The present invention yields a superior effect in that an epitaxial wafer having a highly flat surface can be manufactured while reducing the crystals defects in the SiC epitaxial wafer.

BRIEF DESCRIPTION OF THE DRAWINGS

FIG. 1 is a diagram for explaining the situation of the generation and reduction of defects in the wafer, wherein FIG. 1a shows an off wafer and FIG. 1b shows a zero-off wafer;

FIG. 2 is a schematic explanatory diagram of the growth process of the present invention;

FIG. 3 is a diagram showing the atomic force microscopy of the cleansed face of the SiC substrate, wherein FIG. 3a is a planar image and FIG. 3b is a cross-sectional image;

FIG. 4 is a surface view of the epitaxial wafer manufactured with the present invention;

FIG. 5 is an reflective X-ray photograph showing an example of the reduction of crystal defects in the epitaxial wafer manufactured with the present invention, wherein FIG. 5a shows the SiC substrate, and FIG. 5b shows the epitaxial wafer, respectively; and FIG. 6 is an explanatory diagram of the improvement in yield of the SiC ingot of the present invention.

Description of Reference Numerals
(1) Crystal defects extending in the {0001} direction
(2) Crystal defects extending in a direction that is perpendicular to the {0001} direction
(3) Cutting stock

DETAILED DESCRIPTION OF THE INVENTION

With the present invention, by manufacturing the epitaxial wafer with a SiC substrate whose off angle is less than 1° from the {0001} face, as shown in FIG. 1b, defects (2) extending in a direction that is perpendicular to the {0001} direction existing in the substrate can be suppressed from propagating to the epitaxially grown portion, and crystal defects (1) and (2) in the epitaxial wafer can be reduced thereby.

In particular, in order to increase the flatness of the epitaxial wafer surface, it is desirable to perform epitaxial growth to the (000$\overline{1}$) C face.

Further, by controlling the growth pressure to be 250 mbar or less, and controlling the flow rate of the source gas so that the composition ratio of C and Si in source gases becomes 1 or less; in other words, by controlling the growth pressure to be 250 mbar or less and the composition ratio of C and Si in source gases to be 1 or less while using the (000$\overline{1}$) C face, deterioration in the flatness of the growth surface caused by step bunching or two-dimensional nucleus formation can be suppressed, and a wafer having a highly flat epitaxial wafer surface with reduced crystal defects can be manufactured thereby.

FIG. 4 (photograph of the following Examples is incorporated) shows the surface of the epitaxial wafer after 5 hours of growth, and, by using the (000$\overline{1}$) C face, there is no surface roughness caused by step bunching or two-dimensional nucleus formation, and a flat surface is formed thereby.

FIG. 5a shows defects in the SiC substrate. The crystal defects extending in the {0001} direction visible as white dots in the SiC substrate. In addition, there are crystal defects extending in a direction that is perpendicular to the {0001} direction visible in the form of a line.

Nevertheless, according to the present invention, as shown in FIG. 5b (photograph of the following Examples is incorporated), the linear defects that existed in the SiC substrate are hardly visible in the epitaxial wafer, and it is evident that the defects have decreased. Like this, as a result of employing the present invention, an epitaxial wafer having a highly flat surface can be manufactured while reducing the crystal defects in the SiC epitaxial wafer.

Further, the present invention enables the improvement in the yield of the SiC ingot. Generally, a SiC ingot is manufactured by growing in the {0001} direction. When cutting a SiC substrate that is 8° off from {0001} direction, cutting stock (3) of 10 mm as shown in FIG. 6a will arise if the ingot has a diameter of 75 mm (3 inches).

Meanwhile, when epitaxial growth is enabled where the off angle of the SiC substrate is less than 1° according to the present invention, as shown in FIG. 6b, the cutting stock upon cutting the SiC substrate will hardly arise, and the yield is improved thereby.

Further, by forming a pin diode on the epitaxial wafer manufactured according to the present invention, the long-term reliability upon applying forward voltage of the semiconductor device can be improved.

With the SiC Pin diode formed on the off substrate, the crystal defects extending in a direction perpendicular to the {0001} direction in the epitaxial wafer will cause the forward current to decrease when the forward voltage is applied for a prolonged period of time.

Nevertheless, with the epitaxial wafer manufactured according to the present invention, since the crystal defects extending in a direction that is perpendicular to the {0001} direction in the epitaxial wafer have been reduced as described above, the forward current will not decrease even when applying forward voltage for a prolonged period of time, and a significant effect is yielded in that a highly reliable epitaxial wafer can be obtained.

Further, by forming a MOSFET on the epitaxial wafer manufactured according to the present invention, the channel resistance of the semiconductor device can be reduced.

In other words, in comparison to a MOSFET formed on a conventional epitaxial wafer having an off angle of 3° to 8°, the MOSFET formed on the epitaxial wafer manufactured according to the present invention is capable of reducing the roughness in the oxide film/semiconductor interface.

As a result, the channel mobility will increase, and the channel resistance of the semiconductor device can be reduced thereby. The present invention is now described in further detail with reference to the following Examples.

EXAMPLES

FIG. 2 shows the conceptual diagram of the series of growth processes of the present Examples. A 4H—SiC substrate inclined 0.50 from the (000$\overline{1}$) C face to the [11$\overline{2}$0] direction was used as the crystal growth substrate.

After placing this substrate in the reaction tube of a horizontal chemical vapor deposition system (CVD system), the pressure in the reaction tube was controlled to be 250 mbar while flowing 40 slm of hydrogen gas in the reaction tube.

In this state, the SiC substrate was heated via high-frequency induction heating, and heated from 1500° C. to 1600° C. while discharging 3.33 sccm of propane gas. After heating the SiC substrate to 1600° C., this state was maintained for 3 minutes, and the SiC substrate surface was cleansed.

FIG. 3 shows the atomic force microscopy of the cleansed SiC substrate surface. FIG. 3a is a planar image, and steps are aligned with regularity. The height thereof is 0.7 nm from the cross sectional image of FIG. 3b.

After preparing this kind of cleansed surface, the composition ratio of C and Si in source gases was controlled to be 0.6 by introducing 6.67 sccm of silane gas and 1.334 sccm of propane gas, and epitaxial growth was performed on this SiC substrate in order to manufacture an epitaxial wafer.

FIG. 4 shows the surface of the epitaxial wafer after 5 hours of growth. By using the (000$\overline{1}$) C face, there is no surface roughness caused by step bunching or two-dimensional nucleus formation, and a flat surface is formed thereby.

Further, as shown in FIG. 5b, the linear defects that existed in the SiC substrate are hardly visible in the epitaxial wafer obtained in this Example, and it is evident that the defects have decreased.

As evident from the foregoing explanation, it has been confirmed that, by using the present invention, it is possible to manufacture an epitaxial wafer with a highly flat surface while reducing the crystal defects in the SiC epitaxial wafer.

Although 4H—SiC was used in this Example, the same effects can also be obtained with 6H—SiC. Further, although a substrate that is off in the [11$\overline{2}$0] direction was used in this Example, the present invention can be implemented without depending on the off direction.

According to the present invention, it is possible to manufacture an epitaxial wafer with a highly flat surface while reducing the crystal defects in the SiC epitaxial wafer, the cutting stock upon cutting the SiC ingot will hardly arise, and the yield can be improved thereby. Further, a significant effect is yielded in that a highly reliable epitaxial wafer can be obtained in which the forward current will not decrease even when forward voltage is applied for a prolonged period of time. Moreover, with a MOSFET formed on this epitaxial wafer, it is possible to reduce the roughness in the oxide film/semiconductor interface, and the channel mobility will increase. Thus, a superior effect is yielded in that the channel resistance of the semiconductor device will decrease, and this epitaxial wafer is extremely useful as the material of a semiconductor device or the like.

The invention claimed is:

1. A silicon carbide epitaxial wafer which is formed on a substrate that is less than 1° off from the {0001} surface of silicon carbide having an α-type crystal structure, said silicon carbide epitaxial wafer being formed on a {0001} C face of the substrate and said substrate being a silicon carbide substrate having a 4H crystal structure, and further comprising a semiconductor device formed on said silicon carbide epitaxial wafer.

2. A silicon carbide epitaxial wafer according to claim 1, wherein said silicon carbide epitaxial wafer has the same 4H α-type crystal structure as the silicon carbide substrate.

3. A silicon carbide epitaxial wafer according to claim 1, wherein said silicon carbide epitaxial wafer has a flat surface.

4. A manufacturing method of a silicon carbide epitaxial wafer, comprising the steps of:
    cleansing a surface of a silicon carbide substrate with a mixed gas of hydrogen gas and propane gas at 1400° C. to 1600° C. to provide the substrate with a surface step of a height of 1 nm or less;
    epitaxially growing silicon carbide on a {0001} C face of the substrate that is less than 1° off from the {0001} surface of silicon carbide having an α-type crystal structure, the silicon carbide substrate having a 4H crystal structure; and
    during said epitaxially growing step, using a source gas of silane and propane having a compositional ratio of C and Si of 1 or less and a growth pressure of 250 mbar or less.

5. A method according to claim 4, wherein said step of epitaxially growing silicon carbide on the silicon carbide substrate produces homoepitaxially grown silicon carbide of the same 4H α-type crystal structure as that of the silicon carbide substrate.

6. A silicon carbide epitaxial wafer on which a semiconductor device is formed prepared by a process comprising the steps of:
    cleansing a surface of a silicon carbide substrate with a mixed gas of hydrogen gas and propane gas at 1400° C. to 1600° C.;
    epitaxially growing silicon carbide on a {0001} C face of the substrate that is less than 1° off from the {0001} surface of silicon carbide having an α-type crystal structure, said silicon carbide substrate having a 4H crystal structure; and
    during said epitaxially growing step, using a source gas of silane and propane having a compositional ratio of C and Si of 1 or less and a growth pressure of 250 mbar or less.

7. A silicon carbide epitaxial wafer according to claim 6, wherein the silicon carbide epitaxially grown on the silicon carbide substrate has the same 4H α-type crystal structure as the silicon carbide substrate.

* * * * *

UNITED STATES PATENT AND TRADEMARK OFFICE
CERTIFICATE OF CORRECTION

PATENT NO. : 7,635,868 B2  Page 1 of 1
APPLICATION NO. : 10/567729
DATED : December 22, 2009
INVENTOR(S) : Kojima et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 638 days.

Signed and Sealed this

Twenty-first Day of December, 2010

David J. Kappos
*Director of the United States Patent and Trademark Office*